United States Patent
Kanoh

(10) Patent No.: US 7,372,324 B2
(45) Date of Patent: May 13, 2008

(54) DIGITAL AMPLIFIER

(75) Inventor: Masaya Kanoh, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 154 days.

(21) Appl. No.: 11/350,551

(22) Filed: Feb. 9, 2006

(65) Prior Publication Data

US 2006/0181342 A1 Aug. 17, 2006

(30) Foreign Application Priority Data

Feb. 14, 2005 (JP) .............................. 2005-036023

(51) Int. Cl.
*H03F 3/38* (2006.01)
*H03F 3/217* (2006.01)
(52) U.S. Cl. ........................................ 330/10; 330/251
(58) Field of Classification Search ................ 330/251, 330/207 A
See application file for complete search history.

(56) References Cited

U.S. PATENT DOCUMENTS 5,898,340 A * 4/1999 Chatterjee et al. .......... 330/251

FOREIGN PATENT DOCUMENTS

JP 2004007324 1/2004

* cited by examiner

*Primary Examiner*—Steven J. Mottola
(74) *Attorney, Agent, or Firm*—Pillsbury Winthrop Shaw Pittman LLP

(57) ABSTRACT

Switching circuits constituted by FETs are inserted between power supplies +VB and −VB and a speaker serving as a load respectively, and switched on/off by a pulse train so as to drive the speaker. A pulse generation circuit is a circuit by which a pulse train subjected to pulse width modulation in accordance with an input signal is supplied to the switching circuits. The pulse generation circuit can control the amplitude of the pulse train in accordance with a control signal. Filters limit specific frequency band components in a power supply voltage waveform between the power supplies, and supply the power supply voltage waveform to a gain control circuit in the pulse generation circuit as the control signal.

4 Claims, 3 Drawing Sheets

US 7,372,324 B2

DIGITAL AMPLIFIER

BACKGROUND OF THE INVENTION

The present invention relates to a digital amplifier suitable for an audio amplifier or the like.

There is a digital amplifier which generates a pulse train subjected to pulse width modulation in accordance with an input signal, and switches a switching amplifier stage inserted between a power supply and a speaker based on the pulse train so as to drive the speaker. In such a digital amplifier, a power supply voltage fluctuates due to the switching operation of the switching amplifier stage so that the gain fluctuates. Without any countermeasure, waveform distortion occurs in the drive waveform of the speaker due to the fluctuation of the power supply voltage. In order to prevent such waveform distortion from occurring, a related digital amplifier detects the waveform of the power supply voltage applied to the switching amplifier stage, and makes control to keep the gain constant on the basis of the detected waveform. Such a digital amplifier is, for example, disclosed in Japanese Patent Laid-Open No. 2004-7324 (Patent Document 1).

In the related digital amplifier, the power supply voltage waveform is fed back directly to a control circuit for keeping the gain constant. Therefore, a signal component unnecessary for control to keep the gain constant, such as switching noise included in the power supply voltage waveform, is also used for the gain control. Thus, there is a problem that sound reproduction may be adversely affected.

SUMMARY OF THE INVENTION

The present invention is developed in view of the aforementioned circumstances. It is an object of the invention to provide a digital amplifier in which any unnecessary frequency band component in a power supply voltage waveform is not used for control to keep the gain constant, but proper sound reproduction can be performed.

In order to solve the aforesaid object, the invention is characterized by having the following arrangement.

(1) A digital amplifier comprising:
   a pulse generating unit that generates a pulse train subjected to a pulse width modulation in accordance with an input signal, the pulse generating unit controlling degree of modulation in the pulse width modulation in accordance with a control signal;
   a switching circuit inserted between a power supply and a load, the switching circuit including a switching device to be switched on/off by the pulse train generated by the pulse generating unit so as to drive the load; and
   a filter unit that limits a specific frequency band component in a power supply voltage waveform of the power supply to generate the control signal.

(2) The digital amplifier according to (1), wherein the filter unit has a variable frequency transfer characteristic.

(3) The digital amplifier according to (1), wherein the filter unit includes a low pass filter.

(4) The digital amplifier according to (1), wherein the pulse generating unit includes a triangular wave generation circuit for generating a triangular wave, a pulse width modulation circuit for comparing the input signal and the triangular wave and outputting the pulse train, and a gain control circuit for controlling amplitude of the triangular wave in accordance with the control signal generated by the filter unit.

DETAILED DESCRIPTION OF PREFERRED EMBODIMENTS

Embodiments of the invention will be described below with reference to the drawings.

First Embodiment

Figure 1:
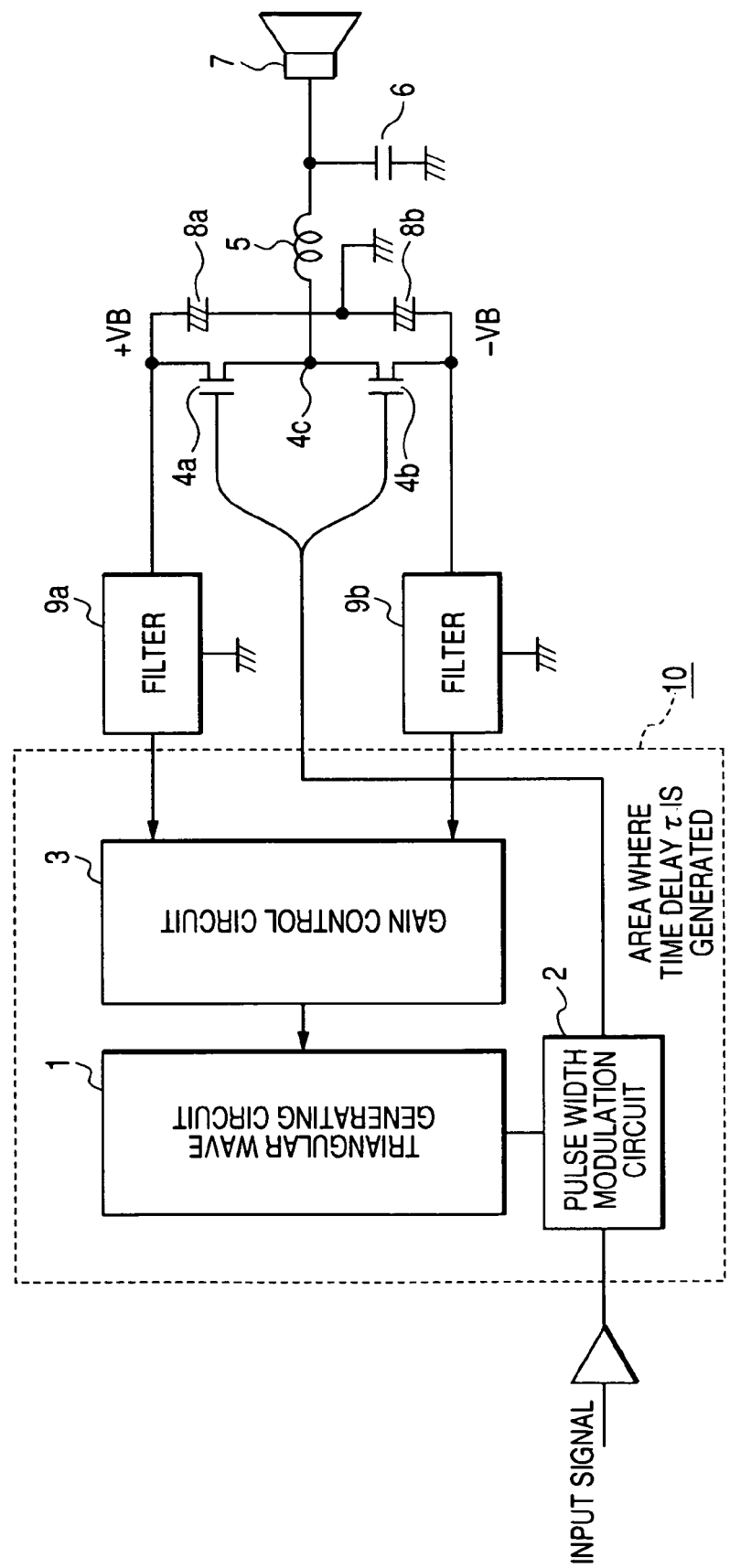
FIG. 1 is a circuit diagram showing the configuration of a digital amplifier according to a first embodiment of the invention.

FIG. 1 is a circuit diagram showing the configuration of a digital amplifier according to a first embodiment of the invention. In FIG. 1, a triangular wave generation circuit 1, a pulse width modulation circuit 2 and a gain control circuit 3 constitute a pulse generation circuit 10 for outputting a pulse train subjected to pulse width modulation in accordance with an input analog signal. Description will be made more in detail. The triangular wave generation circuit 1 is a circuit for generating a triangular wave in a constant period. The triangular wave generation circuit 1 can control the amplitude of the triangular wave to be generated. The pulse width modulation circuit 2 is, for example, a comparator which compares the triangular wave supplied from the triangular wave generation circuit 1 with the input analog signal so as to output a pulse train having an H level, for example, only in the intervals in which the instantaneous value of the triangular wave generated by the triangular wave generation circuit 1 is lower than the instantaneous value of the input analog signal. The gain control circuit 3 is a circuit for controlling the amplitude of the triangular wave generated by the triangular wave generation circuit 1 in accordance with a given control signal so as to control the gain of the digital amplifier as a whole.

A switching amplifier stage has two FETs (Field Effect Transistors) 4a and 4b which are switching devices. Sources of the FETs 4a and 4b are connected to power supplies +VB and −VB respectively, and drains thereof are connected to each other so as to form an output terminal 4c of the switching amplifier stage. A pulse train is supplied from the pulse width modulation circuit 2 to gates of the FETs 4a and 4b. The FETs 4a and 4b are switched on/off alternately by the pulse train. Thus, the pulse train is output from the output terminal 4c of the switching amplifier stage. Two capacitors 8a and 8b for absorbing a power supply voltage fluctuation caused by the switching operation of the FETs 4a and 4b are inserted in series between the power supplies +VB and −VB. A common node between the capacitors is grounded. The output terminal 4c of the switching amplifier stage is grounded through an inductance 5 and a capacitor 6. A node between the inductance 5 and the capacitor 6 is connected to a speaker 7 serving as a load. Here, the inductance 5 and the capacitor 6 function as a low pass filter for converting the pulse train output to the output terminal 4c of the switching amplifier stage into an analog signal, and supplying the analog signal to the speaker 7.

In this embodiment, a filter 9a is inserted between the power supply +VB and the gain control circuit 3, and a filter 9b is inserted between the power supply −VB and the gain control circuit 3. These filters limit a high-frequency component of the power supply voltage waveform applied to the switching amplifier stage, and supply the power supply voltage waveform to the gain control circuit 3 as a control signal. When a control signal indicating a fall of the power supply voltage is given as the control signal to the gain control circuit 3, the gain control circuit 3 reduces the amplitude of the triangular wave and enhances the degree of modulation of the pulse width modulation circuit 2. When a control signal indicating a rise of the power supply voltage is given as the control signal to the gain control circuit 3, the gain control circuit 3 increases the amplitude of the triangular wave and reduces the degree of modulation of the pulse width modulation circuit 2. Thus, the gain of the digital amplifier as a whole is kept constant. According to this embodiment, the control for keeping the gain constant is performed only upon a specific frequency band component passing through the filters 9a and 9b.

Figure 2:
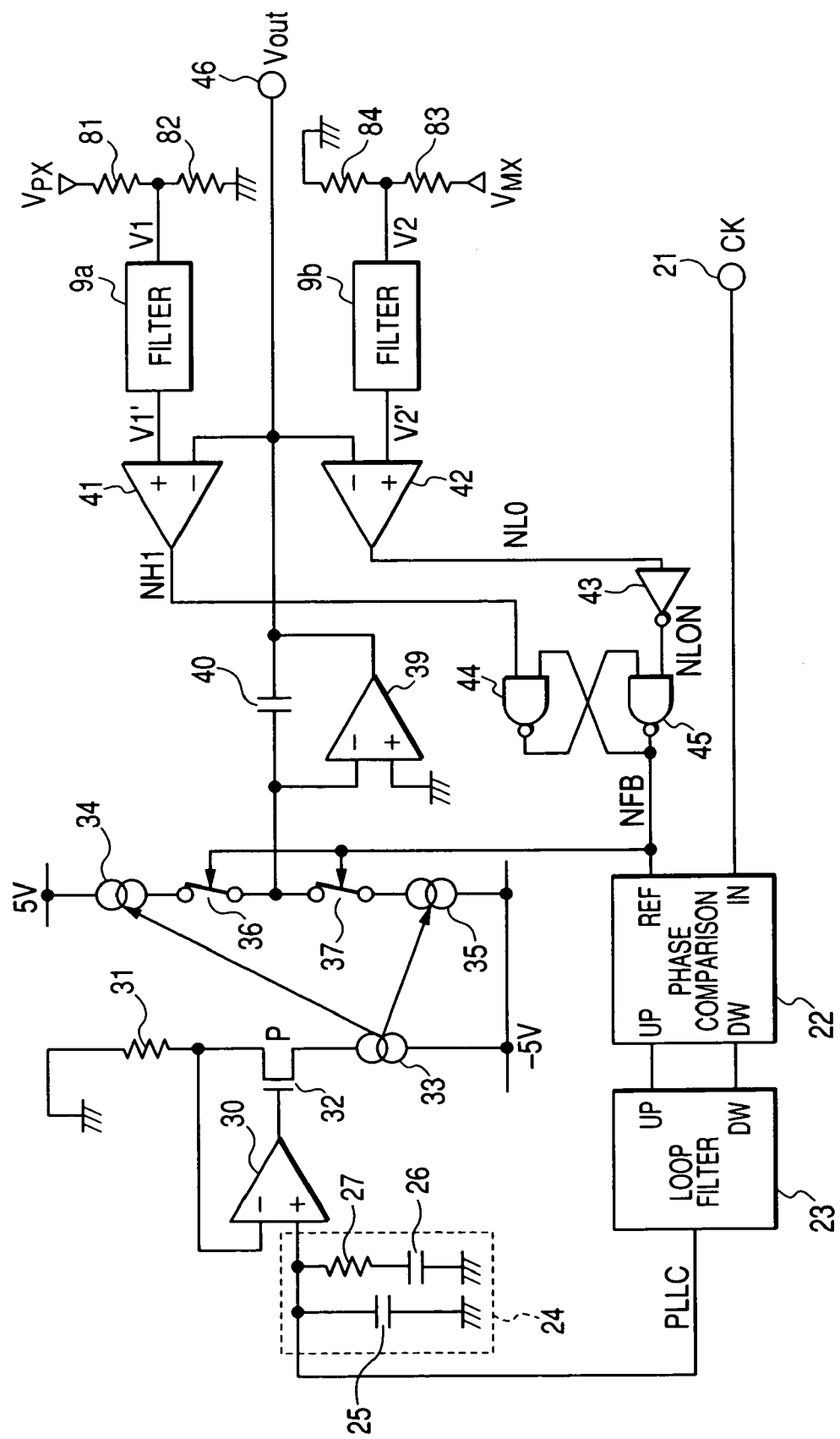
FIG. 2 is a circuit diagram showing a specific circuit example of the same embodiment.

FIG. 2 is a circuit diagram showing a specific example in which this embodiment is applied to the triangular wave generation circuit disclosed in Patent Document 1. In FIG. 2, circuits corresponding to the triangular wave generation circuit 1, the gain control circuit 3 and the filters 9a and 9b in FIG. 1 are shown. The triangular wave generation circuit in Patent Document 1 is used in a digital amplifier similar to that in this embodiment, and the triangular wave generation circuit can adjust the amplitude of the triangular wave in accordance with a control signal. The circuit shown in FIG. 2 has a configuration in which the filters 9a and 9b are added to the triangular wave generation circuit in Patent Document 1. A voltage divider circuit constituted by resistors 81 and 82 divides a power supply voltage VPX of the power supply +VB in FIG. 1 so as to output a voltage V1. A voltage divider circuit constituted by resistors 83 and 84 divides a power supply voltage VMX of the power supply −VB in FIG. 1 so as to output a voltage V2. In the triangular wave generation circuit in Patent Document 1, the voltages V1 and V2 obtained by the voltage divider circuits are supplied directly to comparators 41 and 42. On the other hand, in this embodiment, the voltages V1 and V2 obtained by the two voltage divider circuits pass through the filters 9a and 9b respectively. Thus, high-frequency components of the voltage V1 and V2 are limited so that voltages V1' and V2' with small high-frequency components are formed. The voltages V1' and V2' are supplied to the comparators 41 and 42. In the circuit shown in FIG. 2, a triangular wave Vout synchronizing with a clock CK and varying periodically to draw a slope on a straight line between the voltages V1' and V2' is generated, and output from an output terminal 46. The triangular wave Vout is supplied to the pulse width modulation circuit 2 in FIG. 1. The operation by which the triangular wave is generated thus has been described in detail in Patent Document 1. Here, redundant description will not be made. The disclosure of Japanese Patent Laid-Open No. 2004-7324 (Patent Document 1) is hereby incorporated by reference.

Figure 3A:
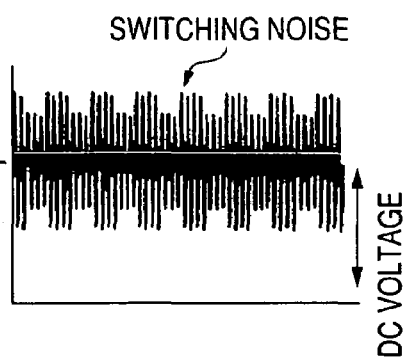
FIGS. 3A-3D are graphs for explaining the effect of the same embodiment.

The effect of the embodiment will be described below in comparison with the related art. When the FETs 4a and 4b are switched on/off by the pulse train from the pulse generation circuit 10 in the digital amplifier shown in FIG. 1, the digital amplifier has a power supply voltage waveform as shown in FIG. 3A due to the influence of the switching. In this power supply voltage waveform, switching noise generated whenever the FETs 4a and 4b are switched on/off, signal ripples corresponding to an input signal waveform to the pulse width modulation circuit 2, and power supply ripples caused by charge/discharge of the capacitors 8a and 8b through the FETs 4a and 4b are superimposed on a DC voltage which is a power supply voltage originally supplied from the power supply.

In the related digital amplifier, the power supply voltage waveform having all of these components is supplied to the gain control circuit 3 as a control signal. However, there is an absolute time delay τ in the path from the gain control circuit 3 to the pulse width modulation circuit 2. As for high-frequency noise such as switching noise, due to the absolute time delay τ, the gain control is performed at inappropriate timing out of timing to control the gain in accordance with the noise. In addition, the switching noise depends on the output signal level of the digital amplifier or the speaker serving as a load, but the switching noise does not have great influence on the gain of the digital amplifier. When the gain is controlled with the switching noise, the switching noise adversely affects sound reproduction nevertheless.

Figure 3B:
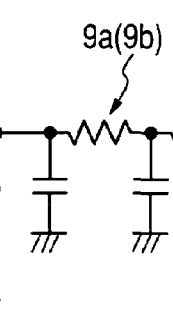
Figure 3C:
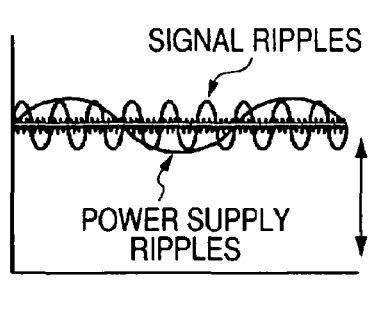
Figure 3D:
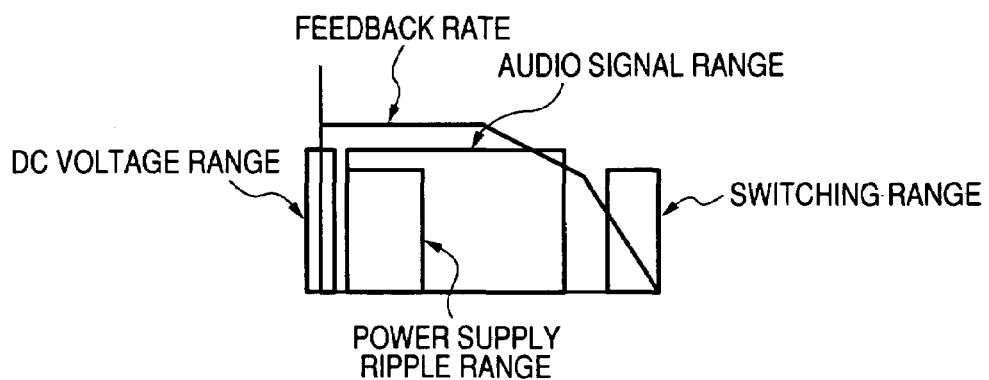

On the other hand, according to this embodiment, a high-frequency component is eliminated from the power supply voltage waveform by the filter 9a (9b) as shown in FIG. 3B by way of example. FIG. 3D shows the frequency transfer characteristic of the filter 9a (9b) by way of example. According to the frequency transfer characteristic of the filter 9a (9b) in this example, of spectra of the power supply voltage waveform, signal components in a DC voltage range, a power supply ripple range and an audio signal range are fed back to the gain control circuit 3 at a sufficient high feedback rate, but a signal component in a switching range is fed back to the gain control circuit 3 with a limited low level. Accordingly, as shown in FIG. 3C, a control signal having a DC voltage component, power supply ripples and signal ripples as its main components but having sufficiently limited switching noise is supplied to the gain control circuit 3. The path from the gain control circuit 3 to the pulse width modulation circuit 2 can respond to the control signal appropriately. According to this embodiment, therefore, proper control to keep the gain constant can be performed only upon components having great influence on the gain, such as power supply ripples and signal ripples.

Second Embodiment

In the first embodiment, filters by which the application range of control to keep the gain constant is limited only to a necessary frequency band are used to prevent the control to keep the gain constant from being performed in an inappropriate mode which may lead to instability of operation. On the other hand, according to this embodiment, the filters by which the application range of the control to keep the gain constant is limited to a necessary frequency band are used to adjust the quality of sound in sound reproduction in accordance with a speaker connected as a load, or the like.

Figure 4:
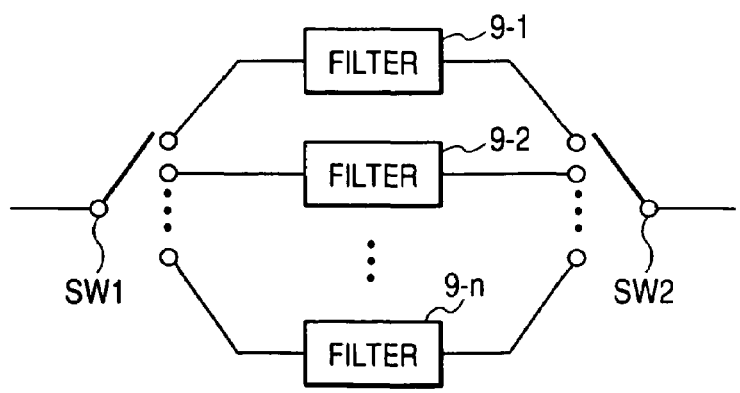
FIG. 4 is a block diagram showing a configuration of a filter to be used in a second embodiment of the invention.

The quality of sound reproduced from the speaker depends on the frequency characteristic of the gain in the sound reproduction system as a whole including the digital amplifier and the speaker. The frequency characteristic of the gain in the sound reproduction system as a whole depends on the speaker connected as a load to the digital amplifier or the sound reproduced by the speaker. Accordingly, in order to obtain desired quality in the reproduced sound, it is desired to adjust the frequency characteristic of the gain in the sound reproduction system as a whole appropriately in accordance with the reproduced sound in the state where the speaker is connected to the digital amplifier. In the configuration shown in FIG. 1, filters are inserted into a feedback path for controlling the gain. The frequency transfer characteristics of the filters have great influence on the frequency characteristic of the gain in the sound reproduction system as a whole. This embodiment pays attention to this point. That is, a filter unit having a variable frequency transfer characteristic is used as each filter 9a, 9b in FIG. 1. Various configurations can be considered as such a filter unit having a variable frequency transfer characteristic. FIG. 4 shows an example thereof. In this example, a filter unit having a variable frequency transfer characteristic is constituted by a plurality of kinds of filters 9-k (k=1 to n) and switches SW1 and SW2 for selecting one from these filters. The plurality of kinds of filters 9-k (k=1 to n) include various filters different in frequency transfer characteristic, such as a low pass filter, a high pass filter, a band pass filter, etc. These filters may be active filters or passive filters. A user can operate a not-shown operation portion to change over the switches SW1 and SW2 and select a filter capable of obtaining desired sound quality. For example, when the gain of a certain frequency band had better be increased to obtain desired sound quality, a filter having a high gain in that frequency band is selected from the filters 9-k (k=1 to n) so as to activate the control to keep the gain constant in that band.

Following modifications can be considered in this embodiment.

(1) Filters having sharp cut-off characteristics may be required as the desired filters 9a and 9b. In order to deal with such a case, the filters 9a and 9b may be designed so that a plurality of stages of filters can be used, and the number of stages of filters can be changed over by the operation of the operation portion.

(2) Filters whose orders can be changed over may be used as the filters 9a and 9b so that the orders can be changed over by the operation of the operation portion. Alternatively, the circuit shown in FIG. 4 may be used as each filter 9a, 9b so that the order of each filter can be changed over by the operation of the operation portion.

(3) Filters whose cut-off frequencies (or eliminate frequencies) can be changed over may be used as the filters 9a and 9b so that the cut-off frequencies can be changed over by the operation of the operation portion. Alternatively, the circuit shown in FIG. 4 may be used as each filter 9a, 9b so that the cut-off frequency of each filter can be changed over by the operation of the operation portion.

What is claimed is:

1. A digital amplifier comprising:
  a pulse generating unit that generates a pulse train subjected to a pulse width modulation in accordance with an audio input signal, the pulse generating unit controlling a degree of modulation in the pulse width modulation in accordance with a control signal;
  a switching circuit inserted between a power supply and a load, the switching circuit including a switching device to be switched on/off by the pulse train generated by the pulse generating unit so as to drive the load; and
  a filter unit that limits a specific frequency band component in a power supply voltage waveform of the power supply to generate the control signal.

2. The digital amplifier according to claim 1, wherein the filter unit includes a low pass filter.

3. A digital amplifier comprising:
  a pulse generating unit that generates a pulse train subjected to a pulse width modulation in accordance with an input signal, the pulse generating unit controlling a degree of modulation in the pulse width modulation in accordance with a control signal;
  a switching circuit inserted between a power supply and a load, the switching circuit including a switching device to be switched on/off by the pulse train generated by the pulse generating unit so as to drive the load; and
  a filter unit that limits a specific frequency band component in a power supply voltage waveform of the power supply to generate the control signal, wherein the filter unit has a variable frequency transfer characteristic.

4. A digital amplifier comprising:
  a pulse generating unit that generates a pulse train subjected to a pulse width modulation in accordance with an input signal, the pulse generating unit controlling a degree of modulation in the pulse width modulation in accordance with a control signal;
  a switching circuit inserted between a power supply and a load, the switching circuit including a switching device to be switched on/off by the pulse train generated by the pulse generating unit so as to drive the load; and
  a filter unit that limits a specific frequency band component in a power supply voltage waveform of the power supply to generate the control signal, wherein the pulse generating unit includes a triangular wave generation circuit for generating a triangular wave, a pulse width modulation circuit for comparing the input signal and the triangular wave and outputting the pulse train, and a gain control circuit for controlling amplitude of the triangular wave in accordance with the control signal generated by the filter unit.

* * * * *